(12) United States Patent
Wakabayashi

(10) Patent No.: US 9,269,599 B2
(45) Date of Patent: Feb. 23, 2016

(54) SUBSTRATE RELAY APPARATUS, SUBSTRATE RELAY METHOD, AND SUBSTRATE PROCESSING APPARATUS

(75) Inventor: Shinji Wakabayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 13/982,812

(22) PCT Filed: Feb. 7, 2012

(86) PCT No.: PCT/JP2012/052765
§ 371 (c)(1),
(2), (4) Date: Jul. 31, 2013

(87) PCT Pub. No.: WO2012/108439
PCT Pub. Date: Aug. 16, 2012

(65) Prior Publication Data
US 2013/0309047 A1    Nov. 21, 2013

(30) Foreign Application Priority Data
Feb. 8, 2011 (JP) ................................. 2011-025389

(51) Int. Cl.
*H01L 21/677*    (2006.01)
*H01L 21/67*    (2006.01)

(52) U.S. Cl.
CPC ........ *H01L 21/677* (2013.01); *H01L 21/67126* (2013.01); *H01L 21/67184* (2013.01); *Y10S 414/139* (2013.01)

(58) Field of Classification Search
CPC ............ H01L 21/67184; H01L 21/677; H01L 21/677715
See application file for complete search history.

(56) References Cited

U.S. PATENT DOCUMENTS

| | | | | |
|---|---|---|---|---|
| 5,695,564 A | * | 12/1997 | Imahashi | H01L 21/67184 118/719 |
| 7,025,554 B2 | * | 4/2006 | Ozawa | H01L 21/67161 414/217 |
| 7,371,683 B2 | * | 5/2008 | Ishizawa | H01L 21/67167 257/E21.159 |
| 8,197,177 B2 | * | 6/2012 | van der Meulen | H01L 21/677 414/805 |
| 8,747,046 B2 | * | 6/2014 | Isomura | H01L 21/67742 414/217 |
| 2011/0318143 A1 | * | 12/2011 | Isomura | H01L 21/67184 414/217.1 |

FOREIGN PATENT DOCUMENTS

JP      2000-150618     5/2000

* cited by examiner

*Primary Examiner* — James Keenan
(74) *Attorney, Agent, or Firm* — IPUSA, PLLC

(57) ABSTRACT

A substrate relay apparatus (200) includes a chassis (202) that is arranged to surround openings (144) formed at side walls of adjacent transfer apparatuses and has a dimension in the width direction between the side walls of the transfer apparatuses that is smaller than the substrate size, a gate valve (201) that is arranged inside the chassis (202) between the side walls of the adjacent transfer apparatuses and is configured to open and close with respect to the openings (144), and support pins (250) that are arranged on both sides of the gate valve (201) and are configured to support a wafer (W) that straddles the gate valve (201).

9 Claims, 13 Drawing Sheets

SUBSTRATE RELAY APPARATUS, SUBSTRATE RELAY METHOD, AND SUBSTRATE PROCESSING APPARATUS

TECHNICAL FIELD

The present invention relates to a substrate relay apparatus that is arranged between transfer apparatuses that are configured to transfer a substrate to be processed such as a semiconductor wafer, a liquid crystal substrate, or a solar cell substrate. The present invention also relates to a substrate relay method and a substrate processing apparatus using such a substrate relay apparatus.

BACKGROUND ART

In a semiconductor device manufacturing process, a substrate processing apparatus that performs a predetermined process such as etching or film deposition on a substrate such as a semiconductor wafer (also simply referred to as "wafer" hereinafter) may be used, for example. Such a substrate processing apparatus may include plural processing apparatuses for performing predetermined processes on a wafer, transfer apparatuses that are connected to the processing apparatuses, and relay chambers (pass chambers) that are arranged between the transfer apparatuses (See e.g., Patent Document 1).

In such a substrate processing apparatus, a wafer may be transferred to/from the processing apparatuses by transfer arm mechanisms that are arranged at the transfer apparatuses, and the wafer may be transferred between the transfer apparatuses via the relay chambers so that the wafer may be successively processed by different processing apparatuses without being exposed to the atmosphere.

As illustrated in Patent Document 1, for example, the relay chamber typically has a stage (buffer) arranged inside its chassis so that a wafer may be temporarily placed thereon to facilitate exchange of the wafer between the transfer arm mechanisms of the transfer apparatuses. For example, in the case of transferring the wafer from one transfer apparatus to another transfer apparatus, the transfer arm mechanism of one transfer apparatus may transfer the wafer into the chassis of the relay chamber and place the wafer on the stage, and the transfer arm mechanism of the other transfer apparatus may pick up the wafer placed on the stage.

PRIOR ART DOCUMENTS

Patent Documents

Patent Document 1: Japanese Laid-Open Patent Publication No. 2000-150618

SUMMARY OF THE INVENTION

Problem to be Solved by the Invention

The typical relay chamber is configured to accommodate the whole wafer within its chassis. Thus, the width of the chassis has to be greater than the diameter of the wafer, and this in turn widens the space between the transfer apparatuses. Thus, when the relay chamber is arranged between the transfer apparatuses, the overall size of the substrate processing apparatus may be increased and the required floor space (footprint) may be increased.

Also, in a case where the relay chamber is connected to the transfer apparatuses via gate valves as disclosed in Patent Document 1, additional space is required between the transfer apparatuses for the gate valves, which results in increased footprint requirements.

Accordingly, it is an object of at least one embodiment of the present invention to provide a substrate relay apparatus that is configured so that footprint requirements may be prevented from increasing when the substrate relay apparatus is arranged between transfer apparatuses.

Means for Solving the Problem

According to an aspect of the present invention, a substrate processing apparatus is provided that includes a plurality of transfer apparatuses that are configured to transfer a substrate to/from a processing apparatus, which performs a predetermined process on the substrate; and a substrate relay apparatus that is arranged between at least two of the transfer apparatuses that are adjacent to each other, the substrate relay apparatus being configured to relay the substrate between the adjacent transfer apparatuses. The substrate relay apparatus includes a chassis that is arranged to surround openings formed at side walls of the transfer apparatuses, the chassis having a dimension in a width direction between the side walls of the transfer apparatuses that is smaller than a size of the substrate. The substrate relay apparatus also includes a gate valve that is arranged inside the chassis between the side walls of the adjacent transfer apparatuses and is configured to open and close with respect to the openings, and at least three support pins that are arranged at both sides of the gate valve and are configured to support the substrate that straddles the gate valve.

According to another aspect of the present invention, a substrate relay apparatus is provided that is arranged between at least two adjacent transfer apparatuses of a plurality of transfer apparatuses that are configured to transfer a substrate to/from a processing apparatus, which performs a predetermined process on the substrate. The substrate relay apparatus includes a chassis that is arranged to surround openings formed on side walls of the adjacent transfer apparatuses, the chassis having a dimension in a width direction between the side walls of the adjacent transfer apparatuses that is smaller than a size of the substrate. The substrate relay apparatus also includes a gate valve that is arranged inside the chassis between the side walls of the adjacent transfer apparatuses and is configured to open and close with respect to the openings; and at least three support pins that are arranged at both sides of the gate valve and are configured to support the substrate that straddles the gate valve.

According another aspect of the present invention, a method of provided for relaying a substrate using a substrate relay apparatus that is arranged between at least two adjacent transfer apparatuses of a plurality of transfer apparatuses that are configured to transfer a substrate to/from a processing unit, which performs a predetermined process on the substrate. The substrate relay apparatus includes a chassis that is arranged to surround openings formed on side walls of the adjacent transfer apparatuses and has a dimension in a width direction between the side walls of the adjacent transfer apparatuses that is smaller than a size of the substrate, a gate valve that is arranged inside the chassis between the side walls of the adjacent transfer apparatuses and is configured to open and close with respect to the openings, and at least three support pins that are arranged at both sides of the gate valve. The substrate relay method includes exchanging the substrate between transfer arm mechanisms that are arranged at the transfer apparatuses, such an exchange involving having the support pins support the substrate that is transferred by a first transfer arm mechanism of the transfer arm mechanisms and is arranged to straddle the gate valve that is open, and having a second transfer arm mechanism of the transfer arm mechanisms receive the substrate from the support pins.

Effects of the Invention

According to an aspect of the present invention, by arranging a gate valve inside the substrate relay apparatus and arranging support pins at both sides of the gate valve to support the substrate that straddles the gate valve, the space between the transfer apparatuses may be narrowed. In this way, space may be conserved and footprint requirements may be prevented from increasing.

EMBODIMENTS FOR IMPLEMENTING THE INVENTION

Figure 1:
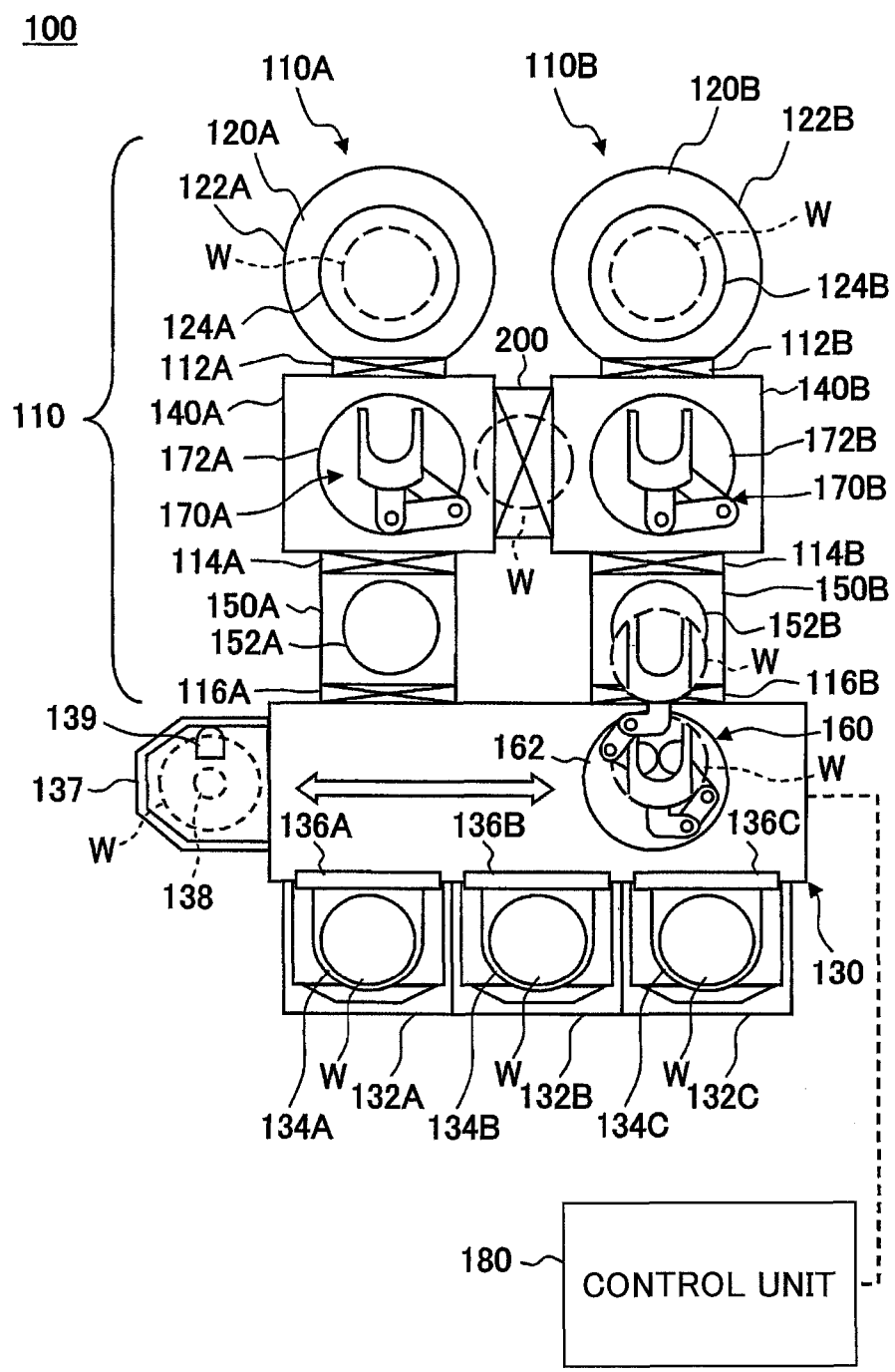
FIG. 1 is a horizontal cross-sectional view of an exemplary configuration of a substrate processing apparatus that may implement a substrate relay apparatus according to an embodiment of the present invention.

In the following, embodiments of the present invention are described with reference to the accompanying drawings. Note that elements and features illustrated in the accompanying drawings and the following descriptions that are substantially identical are given the same reference numerals and repeated descriptions thereof are omitted.

(Substrate Processing Apparatus Configuration)

First, an exemplary configuration of a substrate processing apparatus that may use a substrate relay apparatus according to an embodiment of the present invention is described with reference to the drawings. FIG. 1 is a horizontal cross-sectional view of a substrate processing apparatus 100 according to an embodiment of the present invention. The substrate processing apparatus 100 includes a plurality of vacuum processing units (process boats) 110 for performing predetermined processes (e.g., etching, film deposition, asking, or heat treatment) on a substrate to be processed such as a semiconductor wafer (also simply referred to as "wafer" hereinafter) W and a loader chamber 130 that enables the transfer of the wafer W to/from the vacuum processing units 110.

FIG. 1 illustrates an example in which two vacuum processing units (process boats) 110A and 110B are arranged along a side wall of the loader chamber 130. The vacuum processing units 110A and 110B respectively include processing apparatuses 120A and 120B for processing the wafer W and transfer apparatuses 140A and 140B for transferring the wafer W to/from the processing apparatuses 120A and 120B. Gate valves 112A and 112B are respectively arranged between the processing apparatuses 120A and 120B and the transfer apparatuses 140A and 140B.

The transfer apparatuses 140A and 140B are connected to the side wall of the loader chamber 130 via load-lock chambers 150A and 150B, which may be depressurized. Gate valves (load-lock gate valves) 114A and 114B are respectively arranged between the transfer apparatuses 140A and 140B and the load-lock chambers 150A and 150B. Gate valves (loader gate valves) 116A and 116B are respectively arranged between the gate valves 114A and 114B and the loader chamber 130. The configurations of the transfer apparatuses 140A and 140B are described in detail below.

The vacuum processing units 110A and 110B are configured to perform predetermined processes, which may be the same or different, on wafers W that are placed within the processing apparatuses 120A and 120B. The processing apparatuses 120A and 120B include processing containers 122A and 122B and stages 124A and 124B. The processing apparatuses 120A and 120B are configured to have the wafers W placed on the stages 124A and 124B that are respectively arranged within the processing containers 122A and 122B to perform the predetermined processes on the wafers W.

The load-lock chambers 150A and 150B are respectively configured to temporarily hold the wafers W, transfer the wafer W to the transfer apparatuses 140A and 140B after reducing the pressure to vacuum pressure, and transfer the wafer W to the loader chamber 130 after adjusting the pressure to atmospheric pressure. The load-lock chambers 150A and 150B respectively have stages 152A and 152B arranged in their interior for holding the wafer W.

The loader chamber 130 is arranged into a box structure having a substantially rectangular cross-section where an inert gas such as $N_2$ gas or clean air is circulated. A plurality of cassette stages 132A-132C are arranged side-by-side along one side wall of the loader chamber 130 opposite the side wall along which the vacuum processing units 110A and 110B are arranged. Cassette containers 134A-134C are respectively placed on the cassette stages 132A-132C. Three load ports 136A-136C corresponding to entry ports for the wafer W are arranged at the side wall of the loader chamber 130 for the cassette stages 132A-132C, respectively.

Although FIG. 1 illustrates an example in which a single cassette container, i.e., one of the three cassette containers 134A-134C, is arranged on each of the cassette stages 132A-132C, the number of cassette stages and cassette containers arranged in the substrate processing apparatus is not limited to this example and the number of cassette stages and cassette containers in the substrate processing apparatus may alternatively be one, two, or at least four, for example.

The cassette containers 134A-134C each have the capacity to house wafers W corresponding to at least one lot (e.g., 25 wafers) stacked at uniform pitches, for example. The cassette containers 134A-134C are arranged into sealed structures with their internal spaces filled with $N_2$ gas atmosphere, for example. The wafers W may be transferred to/from the loader chamber 130 via the load ports 136A-136C.

The loader chamber 130 includes an orienter 137 as a positioning device for positioning the wafer W. The orienter 137 includes a rotary stage 138 and an optical sensor 139 that optically detects the peripheral edge of the wafer W, for example. The orienter 137 is configured to align the wafer W by detecting a notch or an orientation flat of the wafer W.

A transfer arm mechanism 160 that transfers the wafer W along the length (along the direction the arrow shown in FIG. 1) of the loader chamber 130 is arranged inside the loader chamber 130. The transfer arm mechanism 160 is configured to transfer the wafer W to/from the cassette containers 134A-134C, the orienter 137, and the load-lock chambers 150A and 150B.

The transfer arm mechanism 160 may include two bendable transfer arms that are rotatably supported by a base 162, for example. The base 162 is configured so that it may be slid by a linear motor drive mechanism, for example, along a guide rail (not shown) that is arranged to extend along the length of the loader chamber 130. The transfer arm mechanism 160 may be a double-arm mechanism as illustrated in FIG. 1, or a single-arm mechanism.

The substrate processing apparatus 100 includes a control unit 180 that controls the operations of various components and an operation unit (not shown) that is connected to the control unit 180. The operation unit may include an operation panel including a touch panel having a display unit such as an LCD (liquid crystal display), for example. The display unit may be configured to display the operation statuses of the various components of the substrate processing apparatus 100, for example. Also, a user may operate the operation panel to direct the execution of various operations with respect to the substrate processing apparatus 100.

In response to the operation of the operation unit, the control unit 180 may execute a specific program based on data such as a preset recipe to control various components. In this way, operations such as wafer transfer and wafer manufacturing processes may be executed.

In the following, an exemplary configuration of the transfer apparatuses 140A and 140B is described. The transfer apparatuses 140A and 140B each include exhaust systems such as vacuum pumps (not shown) so that their internal pressures may be reduced to vacuum pressure. Transfer arm mechanisms 170A and 170B for transferring the wafer W are respectively arranged within the transfer apparatuses 140A and 140B.

The transfer arm mechanism 170A is configured to transfer the wafer W to/from the processing apparatus 120A and the load-lock chamber 150A, and the transfer arm mechanism 170B is configured to transfer the wafer W to/from the processing apparatus 120B and the load-lock chamber 150B.

Each of the transfer arm mechanisms 170A and 170B may have a single transfer arm that is configured to be bendable. The transfer arms of the transfer arm mechanisms 170A and 170B may respectively be rotatably supported by bases 172A and 172B, for example. Note that the transfer arm mechanisms 170A and 170B may be arranged into single-arm mechanisms as illustrated in FIG. 1, or double-arm mechanisms. Also, the transfer arm mechanisms 170A and 170B have picks (end effectors) arranged at their top ends and are configured to be movable up and down to adjust the height positions of the picks.

A substrate relay apparatus 200 that relays the wafer W being transferred between the transfer apparatuses 140A and 140B by temporarily supporting the wafer W while the wafer W is in transit is arranged between the transfer apparatuses 140A and 140B. In this way, the transfer arm mechanisms 170A and 170B may exchange (transfer) the wafer W via the substrate relay apparatus 200 to enable transfer of the wafer W between the transfer apparatuses 140A and 140B.

(Substrate Relay Apparatus Configuration)

Figure 2:
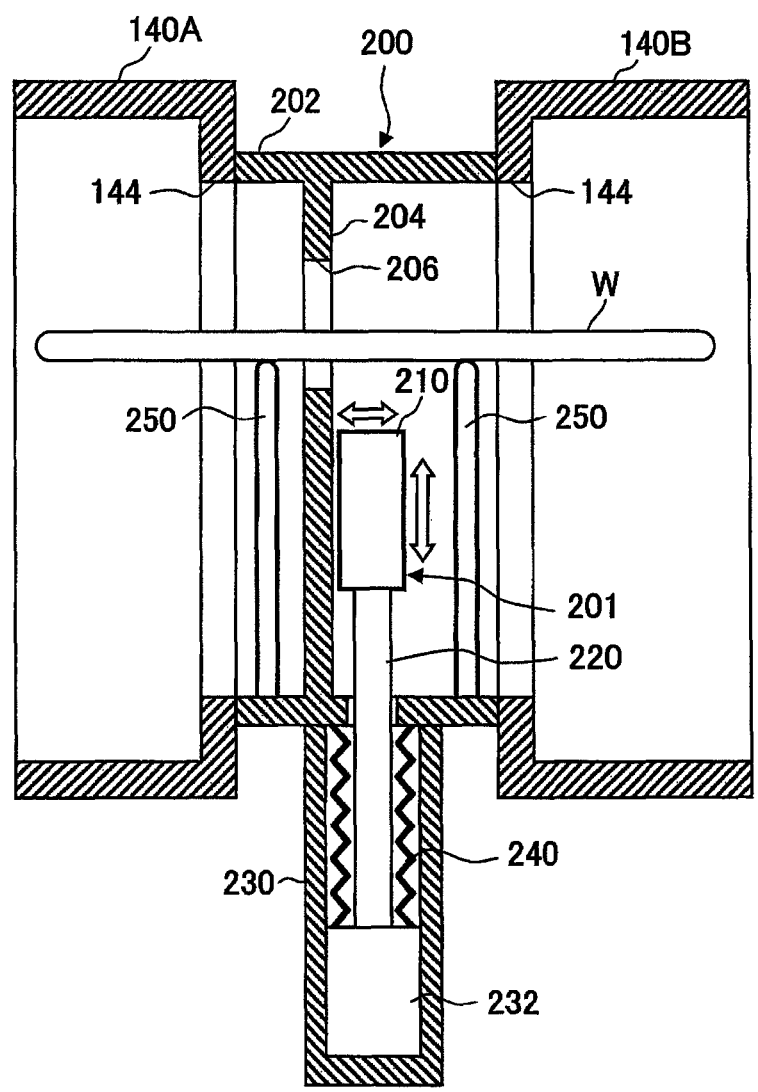
FIG. 2 is a vertical cross-sectional view of an exemplary configuration of the substrate relay apparatus.
Figure 3:
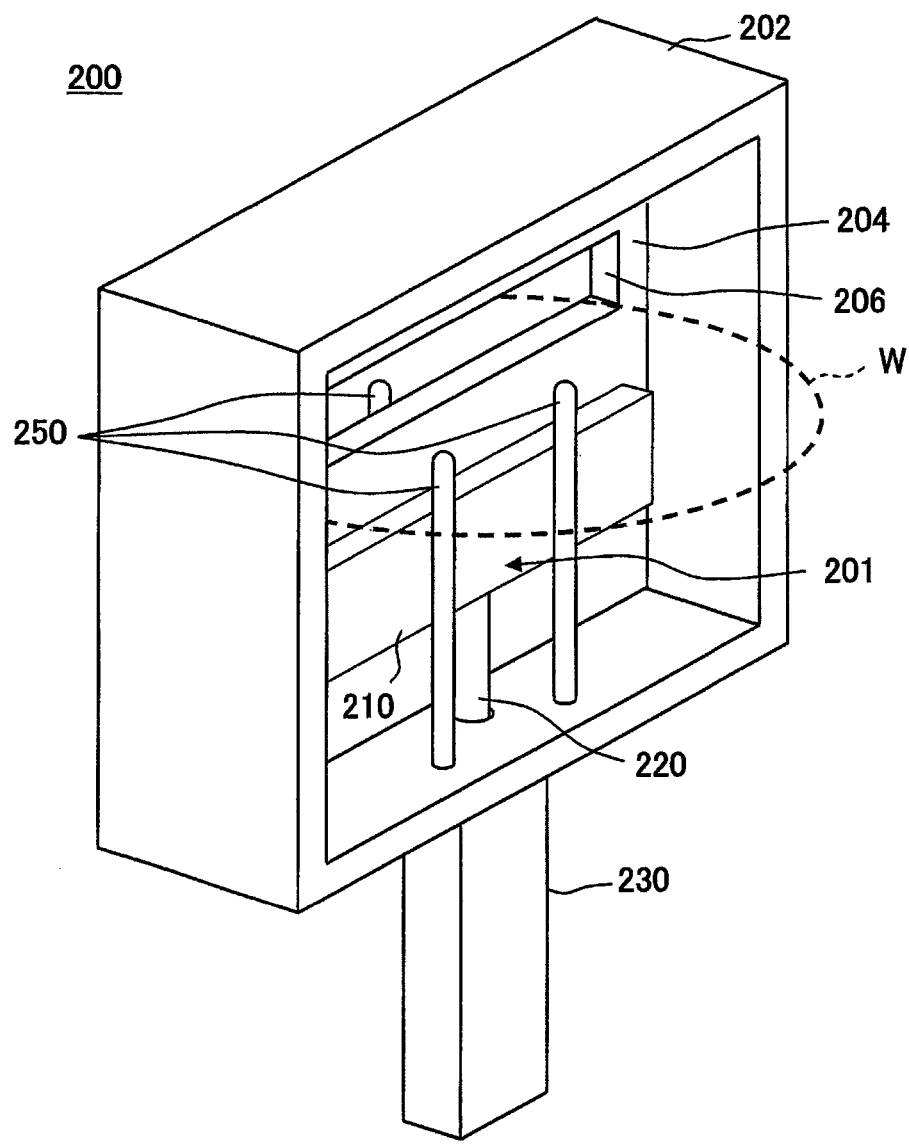
FIG. 3 is an external perspective view of the substrate relay apparatus shown in FIG. 2.

In the following, an exemplary configuration of the substrate relay apparatus 200 is described with reference to the drawings. FIG. 2 is a vertical cross-sectional view of the substrate relay apparatus 200. FIG. 3 is an external perspective view of the substrate relay apparatus 200. As illustrated in FIG. 2, the substrate relay apparatus 200 of the present embodiment includes a substantially box-shaped chassis 202 that surrounds openings 144 formed along the side walls of the transfer apparatuses 140A and 140B, and a gate valve 201 arranged inside the chassis 202. The transfer apparatuses 140A and 140B and the substrate relay apparatus 200 are arranged to be in communication via the opening 144 of the transfer apparatus 140A and the opening 144 of the transfer apparatus 140B so that the wafer W may be transferred from the transfer apparatus 140A to the transfer apparatus 140B via the substrate relay apparatus 200 or from the transfer apparatus 140B to the transfer apparatus 140A via the substrate relay apparatus 200.

The gate valve 201 includes a valve element 210 for opening and closing a substrate transfer port 206 that is formed at a partition wall 204. The partition wall 204 divides the internal space within the chassis 202 into a space on the transfer apparatus 140A side and a space on the transfer apparatus 140B side.

In the example illustrated in FIG. 2, the openings 144 formed at the side walls of the transfer apparatuses 140A and 140B are arranged to substantially correspond to the shape of the chassis 202. However, the shape and position of the openings 144 are not limited to this example but may be arranged into any manner that enables the transfer of the wafer W. For example, the openings 144 may be arranged at the same height as the substrate transfer port 206, or arranged into the same shape as the substrate transfer port 206 or some other suitable shape or position.

The valve element 210 is arranged on a valve seat, which corresponds to a side face of a rim portion of the substrate transfer port 206. The valve element 210 is configured to be movable laterally toward and away from (open/close) the valve seat in addition to being movable up and down. Also, the lateral and longitudinal dimensions of the valve element 210 are arranged to be greater than the lateral and longitudinal dimensions of the substrate transfer port 206. In this way, when the substrate transfer port 206 is closed, the valve element 210 may be pressed against the side face of the rim portion of the substrate transfer port 206 so that the substrate transfer port 206 may be blocked and sealed by the valve element 210. In one preferred embodiment, a seal member such as an O ring may be arranged between the side face of the rim portion of the substrate transfer port 206 and the valve element 210.

The valve element 210 is attached to the top end of an elevating shaft 220 that is configured to be movable up and down. The bottom end of the elevating shaft 220 is inserted through an elevation guide frame 230, which protrudes downward at a center region of the chassis 202, and is connected to a valve element drive unit 232 that is arranged at a bottom portion of the elevation guide frame 230.

The valve element drive unit 232 is configured to drive the valve element 210 to move up and down and drive the valve element 210 to open and close (move toward and away from the substrate transfer port 206). For example, in the case of closing the substrate transfer port 206, the valve element drive unit 232 elevates the valve element 210 to a position where it opposes the substrate transfer port 206 while maintaining an adequate space between the valve element 210 and the partition wall 204 so that they do not come into contact with each other. Then, the valve element drive unit 232 moves the valve element 210 toward the substrate transfer port 206 to block and seal the substrate transfer port 206. On the other hand, in the case of opening the substrate transfer port 206, the valve element drive unit 232 moves the valve element 210 away from the substrate transfer port 206 so that adequate space is secured between the valve element 210 and the partition wall 204 to prevent them from coming into contact with each other. Then, the valve element drive unit 232 lowers the valve element 210 to a standby position so that the valve element 210 does not interfere with wafer transfer operations for transferring the wafer W through the substrate transfer port 206.

Although not illustrated in FIG. 2, the valve element drive unit 232 may include an air cylinder that drives the elevating shaft 220 to move up and down, and a cam mechanism that guides the elevating shaft 220 to implement the above-described up/down movement and opening/closing movement of the valve element 210. For example, a protrusion (not shown) may be arranged at the elevating shaft 220, and a cam hole (not shown) that guides the protrusion may be arranged into a shape that enables the above-described up/down movement and opening/closing movement of the valve element 210. Note, however, that the configuration of the valve element drive unit 232 is not limited to this example.

Because the valve element drive unit 232 may constitute a source of contamination from particle generation, the valve element drive unit 232 has to be isolated from the internal space of the chassis 202, which requires a high level of cleanliness. Accordingly, a bellows 240 is arranged within the elevation guide frame 230. The bellows 240 is arranged to cover the elevating shaft 220 and is configured to be extendable in accordance with the up/down movement of the elevating shaft 220. The bellows 240 is an airtight accordion-like member made of stainless steel or some other anticorrosive material.

The substrate relay apparatus 200 has support pins 250 for supporting the wafer W arranged at the transfer apparatus 140A side and the transfer apparatus 140B side of the gate valve 201. For example, as illustrated in FIG. 3, the support pins 250 may be arranged at both sides of the partition walls 204 to support the wafer W that straddles the gate valve 201. In the example illustrated in FIG. 3, a total of three support pins 250 are arranged inside the substrate relay apparatus 200, one support pin 250 being arranged on one side of the partition wall 204 and two support pins 250 being arranged on the other side of the partition wall 204. The support pins 250 are fixed to the bottom surface of the chassis 202 and are arranged to stand upright. In one preferred embodiment, protective members made of a material that would not attract particles may be arranged at the top ends of the support pins 250 in order to protect the rear face of the wafer W from getting scratched. In one example, resin may be used as the material for such protective members.

In the substrate relay apparatus 200 of the present embodiment, by arranging the support pins 250 at both sides of the gate valve 201, the wafer W may be supported by the support pins 250 while straddling the gate valve 201 (while being inserted through the substrate transfer port 206 that is opened). That is, the wafer W may be supported to extend outside the boundaries of the substrate relay apparatus 200. Thus, in contrast to conventional configurations, the wafer W does not have to be accommodated within the chassis 202, and the dimension of the chassis 202 in the width direction between the side walls of the transfer apparatuses 140A and 140B may be arranged to be smaller than the dimension of the wafer W (substrate size). In this way, the space between the transfer apparatuses 140A and 140B may be reduced so that space may be conserved and footprint requirements may be reduced compared to conventional configurations.

As can be appreciated, the substrate relay apparatus 200 of the present embodiment has a gate valve arranged in its interior and support pins for supporting a wafer W arranged at both sides of the gate valve. With such a configuration, the dimension in the width direction between the side walls of the transfer apparatuses 140A and 140B may be arranged to be smaller than the diameter of the wafer W (substrate size).

That is, rather than accommodating the whole wafer W within the interior of the substrate relay apparatus 200, the wafer W may be supported to straddle the substrate relay apparatus 200 as illustrated in FIG. 2. In other words, the wafer W may have end portions extending into the transfer apparatuses 140A and 140B while being supported by the support pins 250. Thus, the space between the transfer apparatuses 140A and 140B may be arranged to be smaller than the diameter of the wafer W (substrate size). In this way, space may be conserved and footprint requirements may be reduced, for example.

The width of the chassis 202 (width between the side walls of the transfer apparatuses 140A and 140B) may be arranged to be smaller than the size of the wafer W, and may preferably be arranged to be one third (⅓) to one half (½) of the size (diameter) of the wafer W. Also, as the size (diameter) of the wafer W increases, the proportion of the width of the chassis 202 to the size of the wafer W may be decreased. However, the width of the chassis 202 is preferably arranged to be large enough to stably support the wafer W. For example, if the wafer W has a diameter of 300 mm, the width of the chassis 202 is preferably arranged to be 100-150 mm; if the wafer W has a diameter of 450 mm, the width of the chassis 202 is preferably arranged to be 150-225 mm.

Also, as illustrated in FIGS. 2 and 3, the wafer W is placed on the top ends of the support pins 250 while being inserted midway through the substrate transfer port 206. Thus, the height of the support pins 250 is preferably arranged so that the wafer W placed on the top ends of the support pins 250 does not come into contact with the rim of the substrate transfer port 206.

Also, in the example illustrated in FIGS. 2 and 3, the height of the support pins 250 is fixed. In such a case, the transfer arm mechanisms 170A and 170B illustrated in FIG. 1 are preferably arranged to have picks (end effectors) that are configured to be movable up and down so that their height positions may be adjusted. In this way, the wafer W may be easily placed on the support pins 250 by adjusting the height of the wafer W using the transfer arm mechanisms 170A and 170B.

For example, in the case of placing the wafer W on the support pins 250 using the transfer arm mechanism 170A, first, the transfer arm mechanism 170A inserts the wafer W into the substrate transfer port 206 at a height above the support pins 250.

Then, the transfer arm mechanism 170A slightly lowers its pick to place the wafer W on the support pins 250 arranged at both sides of the partition wall 204. Then, the transfer arm mechanism 170A is pulled away so that the wafer W is passed on to the support pins 250.

In the case of passing the wafer W placed on the support pins 250 to the transfer arm mechanism 170B, first, the pick of the transfer arm mechanism 170B that is adjusted to the height of the wafer W is inserted into the substrate transfer port 206. Then, the pick is raised so that the wafer W may be raised above the support pins 250 and passed on to the transfer arm mechanism 170B.

Figure 4A:
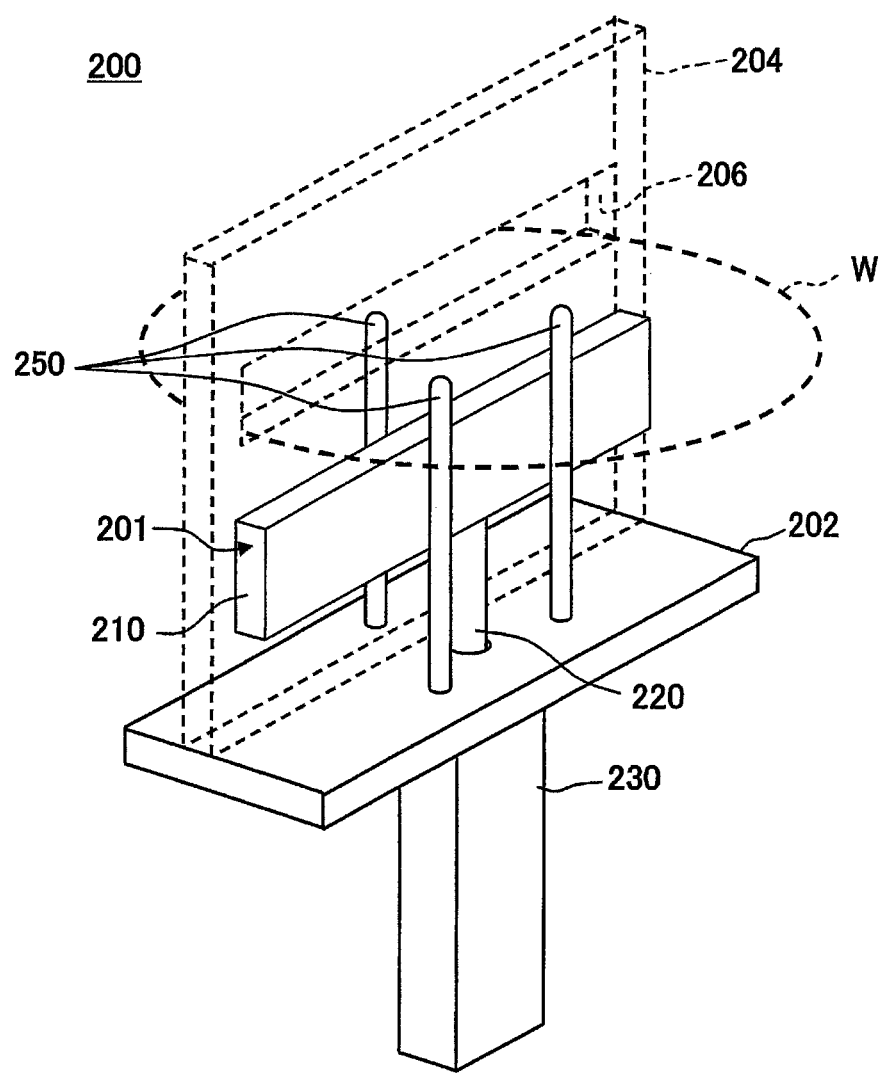
FIG. 4A illustrates a case where a valve element of the substrate relay apparatus shown in FIG. 2 is disposed at a downside retreat position.
Figure 4B:
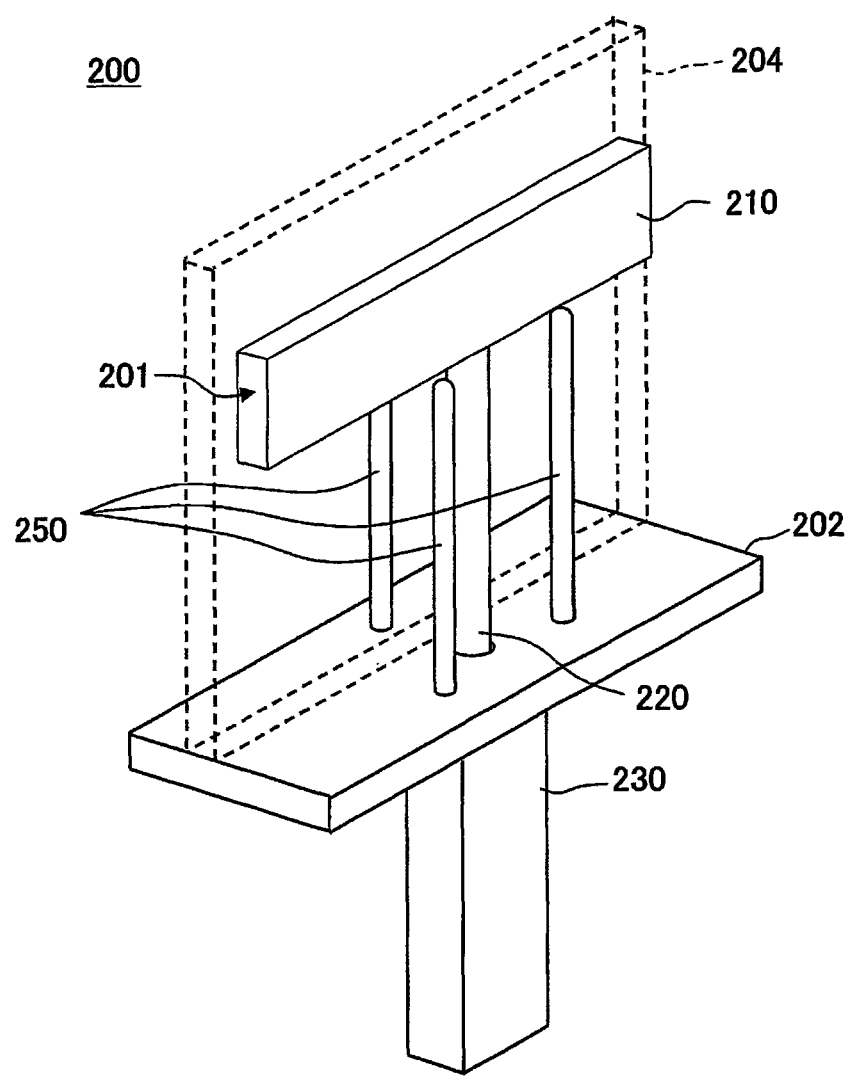
FIG. 4B illustrates a case where the valve element of the substrate relay apparatus shown in FIG. 2 is disposed at an upside closing position for closing a substrate transfer port.

In the following, operations of the substrate relay apparatus 200 of the present embodiment are described with reference to the drawings. FIGS. 4A and 4B illustrate operations of the substrate relay apparatus 200 shown in FIG. 2. In FIGS. 4A and 4B, the partition wall 204 is illustrated by dotted lines and illustrations of some portions of the chassis 202 are omitted in order to provide a better internal view of the substrate relay apparatus 200. FIG. 4A illustrates a case where the valve element 210 is disposed at a downside retreat position. FIG. 4B illustrates a case where the valve element 210 is disposed at an upside closing position for closing the substrate transfer port 206.

During normal operation of the substrate processing apparatus 100, the substrate transfer port 206 is opened and the valve element 210 is moved to the downside retreat position as illustrated in FIG. 4A. In such a state, the wafer W may be exchanged between the transfer arm mechanisms 170A and 170B so that the wafer W may be transferred between the transfer apparatuses 140A and 140B.

For example, in a case where the processing apparatuses 120A and 120B of the substrate processing apparatus 100 are configured to perform the same type of process on the wafer W, the wafer W that is passed on to the transfer arm mechanism 170A or 170B of the transfer apparatus 140A or 140B may be passed to the processing apparatus 120A or 120B via the substrate relay apparatus 200.

In this case, when maintenance operations have to be performed on one of the load-lock chambers such as the load-lock chamber 150B, for example, the gate valve 114B may be closed while the maintenance operations are performed on the load-lock chamber 150B and the wafer W to be processed at the processing apparatus 120B may be transferred to the processing apparatus 120B via the other load-lock chamber 150A, the transfer apparatus 140A, the substrate relay apparatus 200, and the transfer apparatus 140B. In this way, processing of the wafer W may be continued not only at the processing apparatus 120A but also at the processing apparatus 120B so that a decrease in the overall wafer processing throughput may be curbed.

Also, even when maintenance operations have to be performed on one of the processing apparatuses such as the processing apparatus 120B, for example, the gate valve 112B may be closed while the maintenance operations are performed on the processing chamber 120B and the wafer W to be processed at the processing apparatus 120B may be transferred to the other processing apparatus 120A via the load-lock chamber 150B, the transfer apparatus 140B, the substrate relay apparatus 200, and the transfer apparatus 140A. In this way, wafer processing operations may be continued not only with respect to the wafer W to be processed at the processing apparatus 120A but also for the wafer W to be processed at the processing apparatus 120B so that a decreased in the overall wafer processing throughput may be curbed.

Also, when maintenance operations have to be performed on one of the transfer apparatuses 140A or 140B, the valve element 210 may be raised to block the substrate transfer port 206 so that the gate valve 201 of the substrate relay apparatus 200 may be closed as illustrated in FIG. 4B. In this way, even when maintenance operations are performed on one of the transfer apparatus 140A or 140B, operations of the other transfer apparatus 140A or 140B may be continued so that a decrease in the overall wafer processing throughput may be curbed.

Note that although the support pins 250 are fixed to the bottom of the chassis 202 in the above exemplary configuration of the substrate relay apparatus 200, the present invention is not limited to such a configuration. For example, as an alternative configuration, the support pins 250 may be arranged to be movable up and down. The substrate relay apparatus 200 with such an alternative configuration may be used even in a substrate processing apparatus 100 with transfer apparatuses 140A and 140B that have transfer arm mechanisms 170A and 170B that cannot be driven to move up and down.

(Alternative Substrate Relay Apparatus Configuration)

Figure 5:
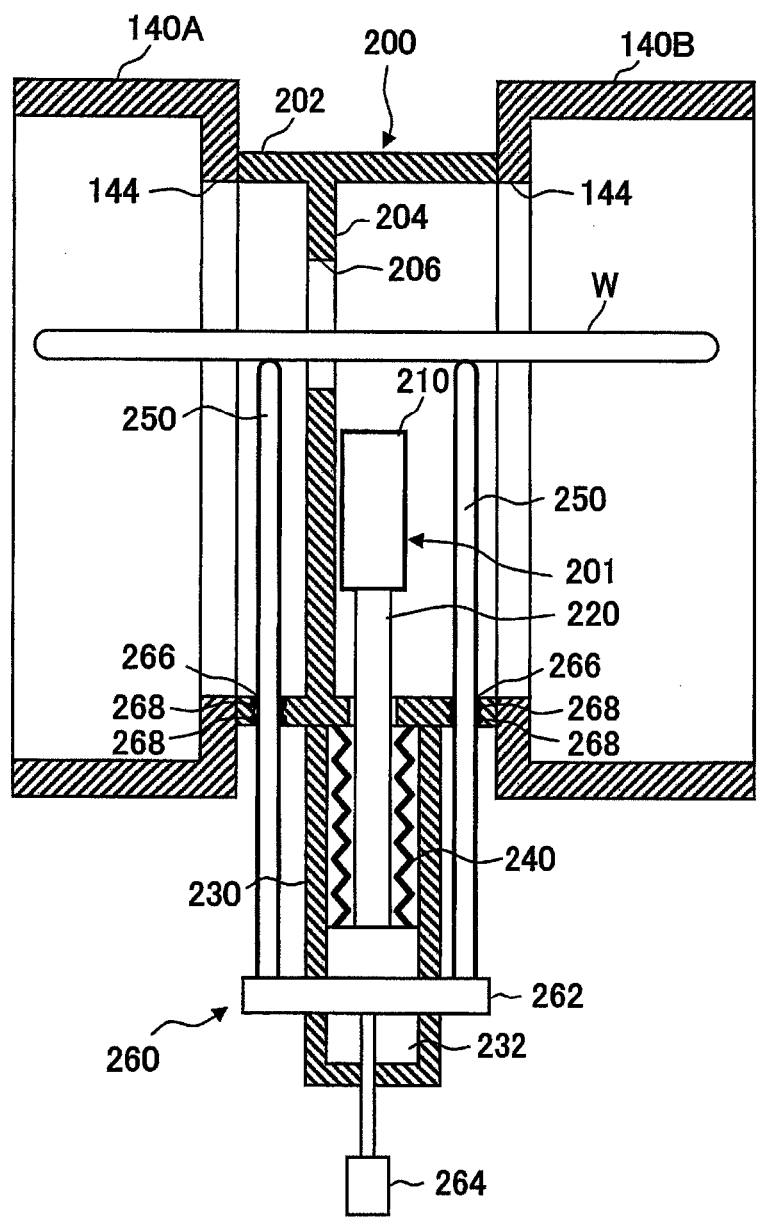
FIG. 5 is a vertical cross-sectional view of another exemplary configuration of the substrate relay apparatus.
Figure 6:
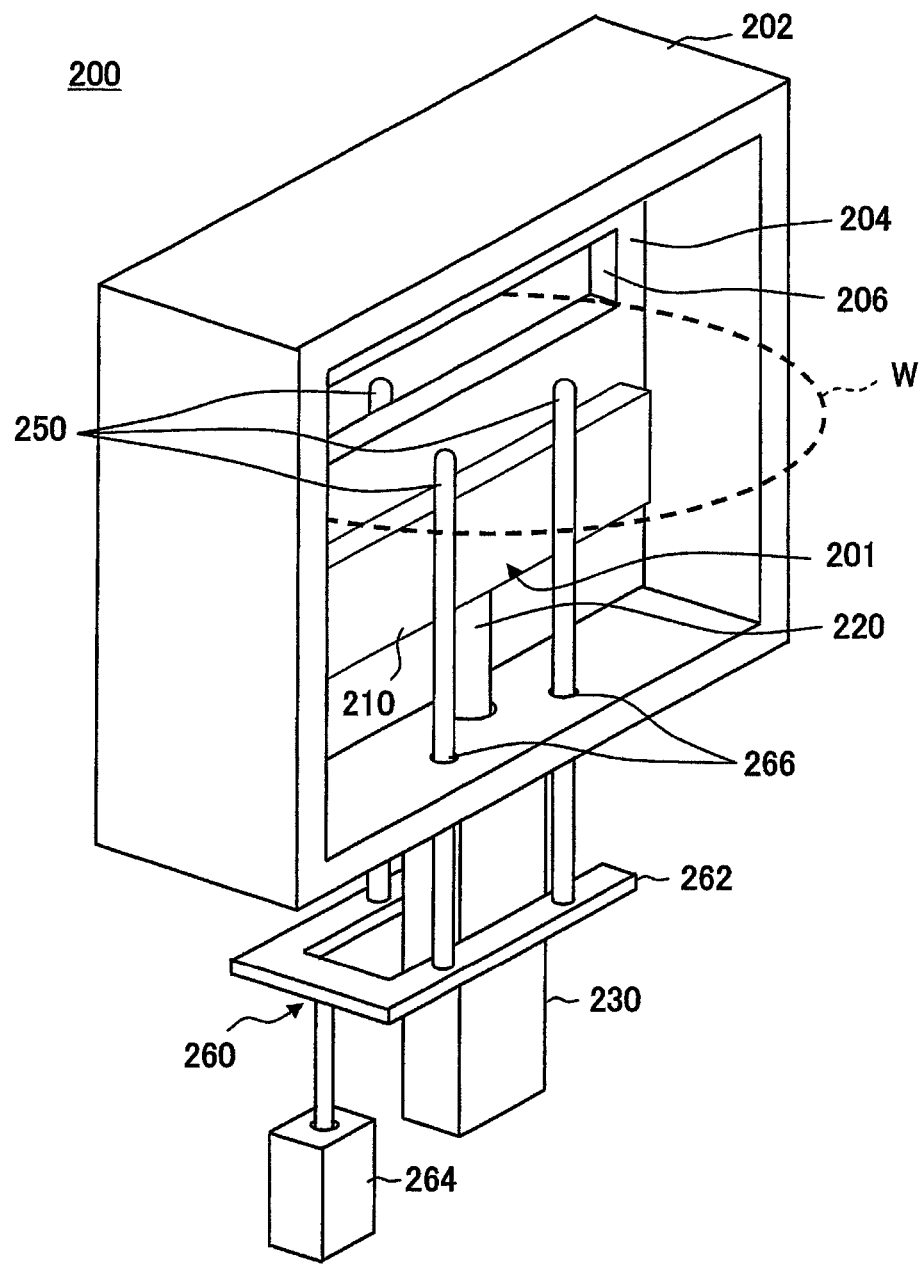
FIG. 6 is an external perspective view of the substrate relay apparatus shown in FIG. 5.

In the following, another exemplary configuration of the substrate relay apparatus 200 that has the support pins 250 arranged to be movable up and down is described. FIG. 5 is a vertical cross-sectional view of the substrate relay apparatus 200 with such a configuration, and FIG. 6 is an external perspective view of such a substrate relay apparatus 200. The substrate relay apparatus 200 illustrated in FIGS. 5 and 6 includes a support pin elevating mechanism 260 for driving the support pins 250 to move up and down. The support pin elevating mechanism 260 includes a base 262 that supports the support pins 250 and an actuator 264 that moves the base 262 up and down.

The support pins 250 are inserted into through holes 266 formed at the bottom of the chassis 202 and are configured to be movable up and down within the through holes 266. Seal members 268 such as O-rings are arranged between the support pins 250 and the through holes 266 to seal the through holes 266. In the example illustrated in FIG. 5, two seal members 268 are arranged at the upper side and lower side of each through hole 266. However, other configurations are possible such as arranging only one seal member 268 at each of the through holes 266, for example. The base 262 is preferably arranged into a suitable shape so that it would not come into contact with the elevation guide frame 230 upon being moved up and down.

In the example illustrated in FIGS. 5 and 6, the base 262 is arranged into a U-shape by two planks connected at one side, with one plank supporting one of the support pins 250 arranged at the transfer apparatus 140A side, and the other plank supporting two of the support pins 250 arranged at the transfer apparatus 140B side. With such a configuration, the base 262 may be arranged to surround the elevation guide frame 230.

Figure 7A:
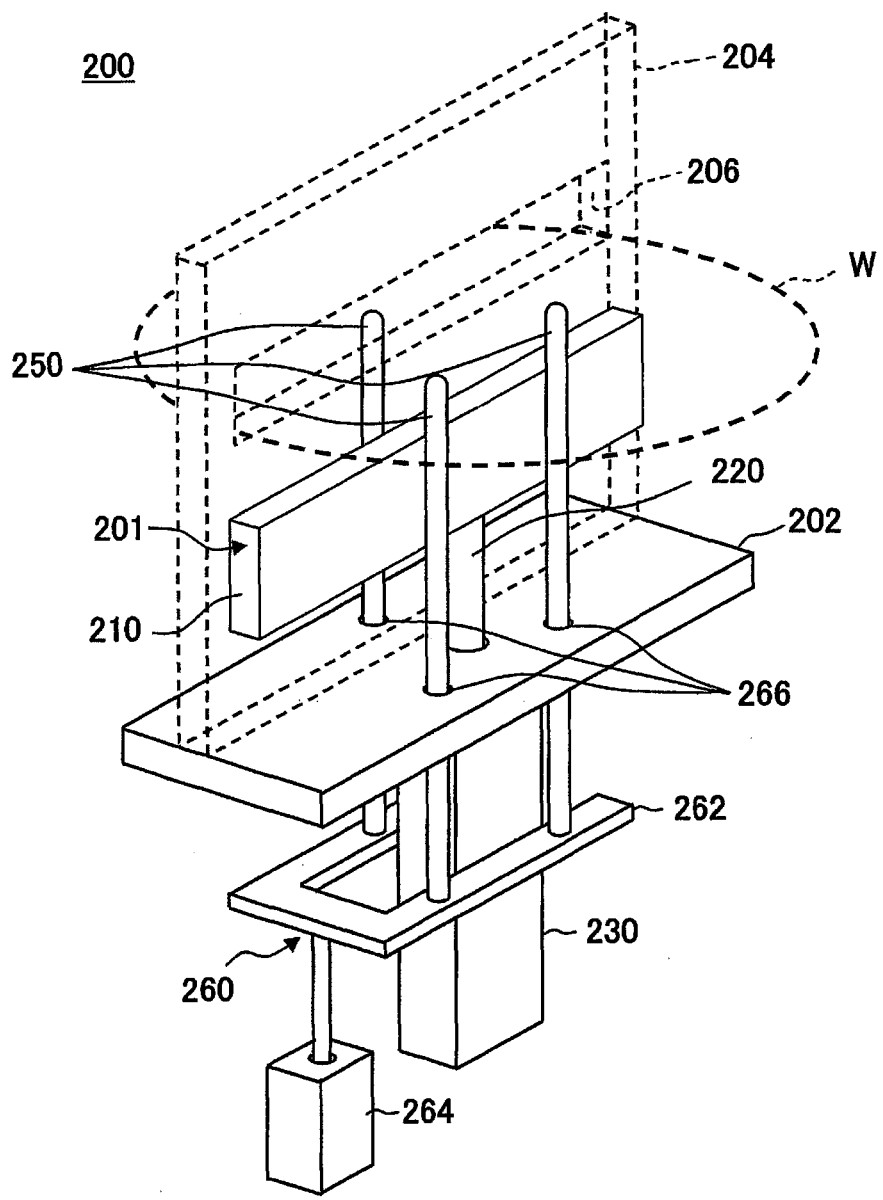
FIG. 7A illustrates a case where support pins of the substrate relay apparatus shown in FIG. 5 are disposed at an upside substrate supporting position for supporting a substrate.
Figure 7B:
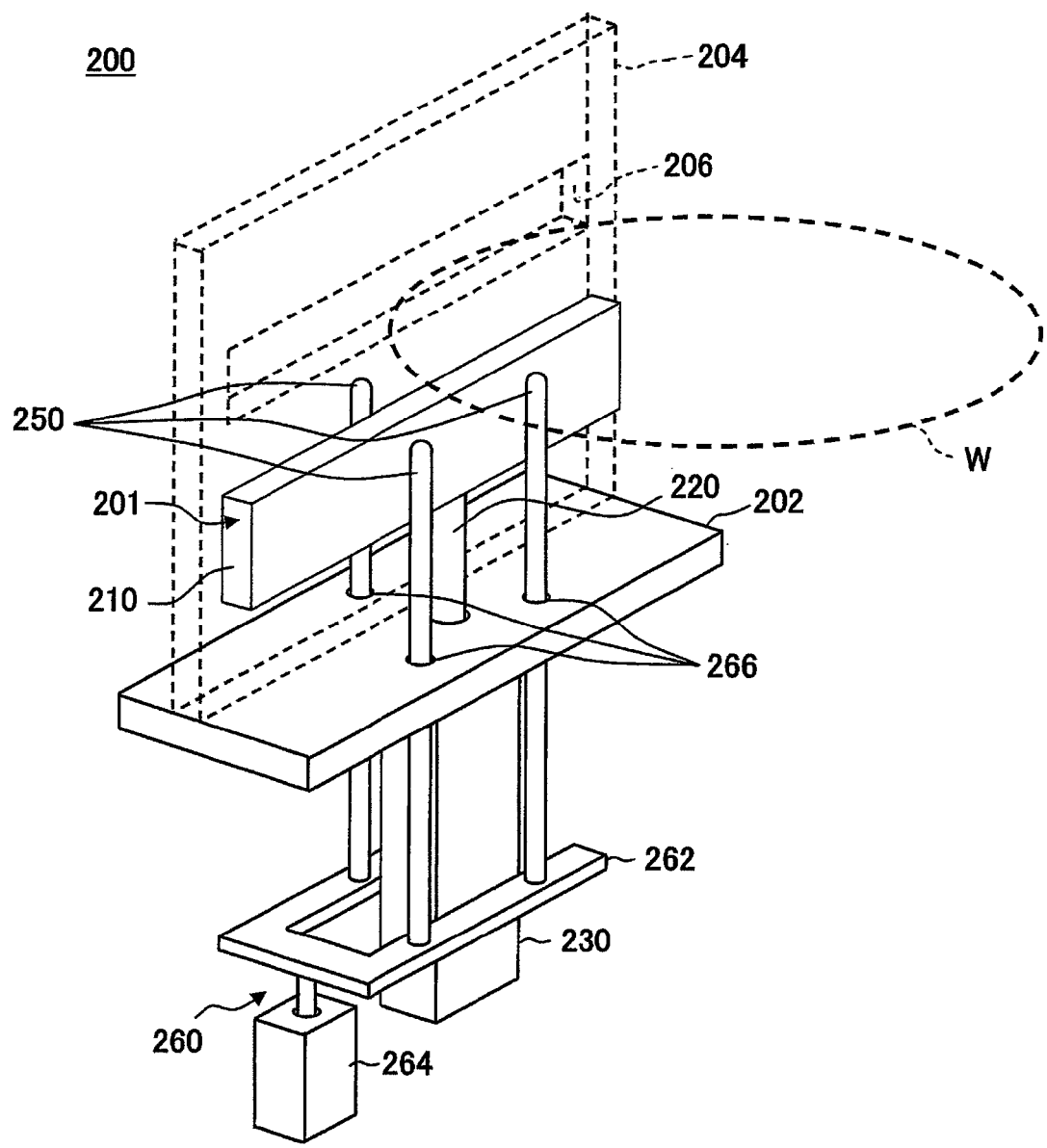
FIG. 7B illustrates a case where the support pins of the substrate relay apparatus shown in FIG. 5 are disposed at a downside retreat position.

In the following, operations of the substrate relay apparatus 200 having the above configuration are described with reference to the drawings. FIGS. 7A and 7B illustrate operations of the substrate relay apparatus 200 shown in FIG. 5. In FIGS. 7A and 7B, the partition wall 204 is illustrated by dotted lines and illustrations of the chassis are partially omitted to provide a better internal view of the substrate relay apparatus 200. FIG. 7A illustrates a case where the support pins 250 are raised to a substrate supporting position, and FIG. 7B illustrates a case where the support pins are lowered to a retreat position. Note that in FIGS. 7A and 7B, illustrations of the transfer arm mechanisms 170A and 170B shown in FIG. 1 are omitted.

The wafer W may be placed on the support pins 250 by passing the wafer W from one of the transfer arm mechanisms 170A or 170B onto the support pins 250. For example, in the case of passing the wafer W from the transfer arm mechanism 170A to the support pins 250, the wafer W is inserted into the substrate transfer port 206 by the transfer arm mechanism 170A from the transfer apparatus 140A side. Then, the arm transfer mechanism 170A is stopped when the wafer W reaches the position illustrated in FIG. 7A.

Then, the base 262 is raised by the actuator 264 so that the support pins 250 may be raised to the positions illustrated in FIG. 7A to receive the wafer W from the transfer arm mechanism 170A. Then, the transfer arm mechanism 170A is pulled away. In this way, the wafer W may be supported by the support pins 250 that are arranged at both sides of the partition wall 204.

Then, in the case where the wafer W on the support pins 250 is to be passed to the transfer arm mechanism 170B, the transfer arm mechanism 170B is inserted into the substrate transfer port 206 from the transfer apparatus 140B side. Then, the transfer arm mechanism 170B is stopped after being inserted to the bottom side of the wafer W. Then, the base 262 is lowered by the actuator 264 so that the support pins 250 are lowered to the positions illustrated in FIG. 7B and the wafer W may be passed to the transfer arm mechanism 170B. Then, the transfer arm mechanism 170B having the wafer W placed thereon is pulled away. In this way, the wafer W may be passed to the transfer arm mechanism 170B.

Figure 8:
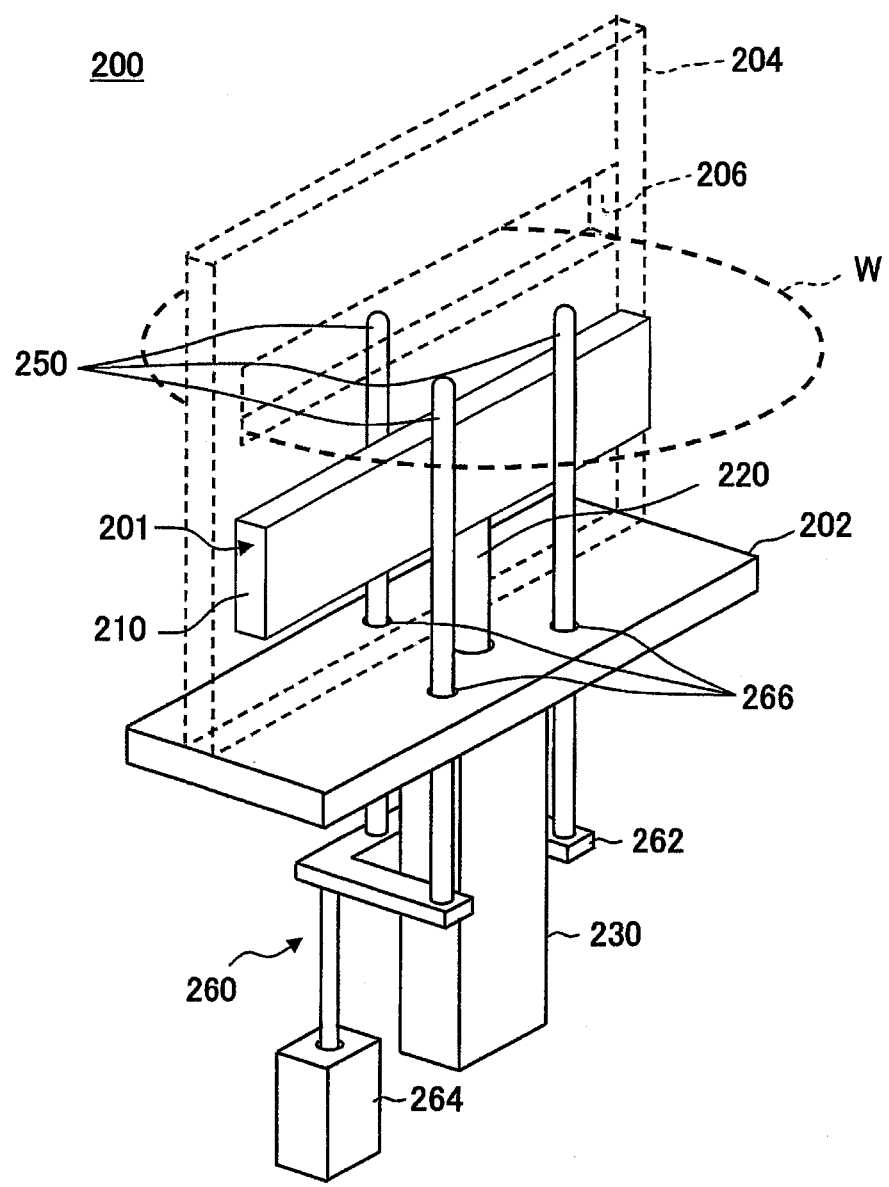
FIG. 8 is a perspective view of an exemplary modified configuration of a support pin elevating mechanism.

Note that the shape of the base 262 is not limited to that illustrated in FIG. 6 but may be any suitable shape that would prevent the base 262 from coming into contact with the elevation guide frame 230 upon being moved up and down. For example, as illustrated in FIG. 8 the U-shape of the base 262 may be arranged at a different orientation from that illustrated in FIG. 6. In other alternative embodiments, the base 262 may be arranged into a doughnut-shape surrounding the elevation guide frame 230, for example.

Figure 9:
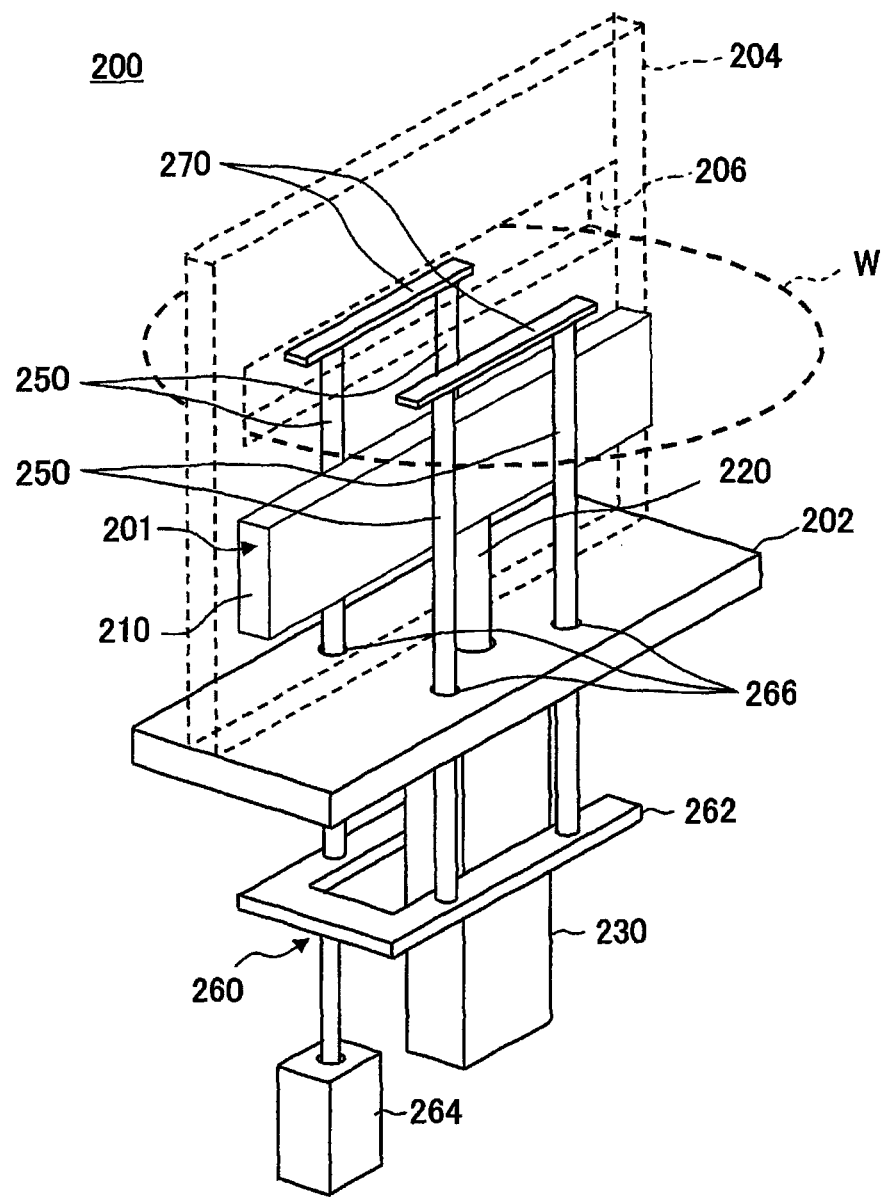
FIG. 9 is a perspective view of another exemplary modified configuration of the support pin elevating mechanism.

Also, the number of support pins 250 is not limited to three but may be four or more, for example. In one alternative embodiment, as illustrated in FIG. 9, the top ends of the support pins 250 may be connected by plate members 270, for example. In this case, the plate members 270 are arranged to connect support pins 250 on one side of the partition wall 204 and connect support pins 250 on the other side of the partition wall 204 so that they would not interfere with the movement of the valve element 210. Thus, in this case, the substrate relay apparatus 200 includes at least four support pins 250.

Figure 10:
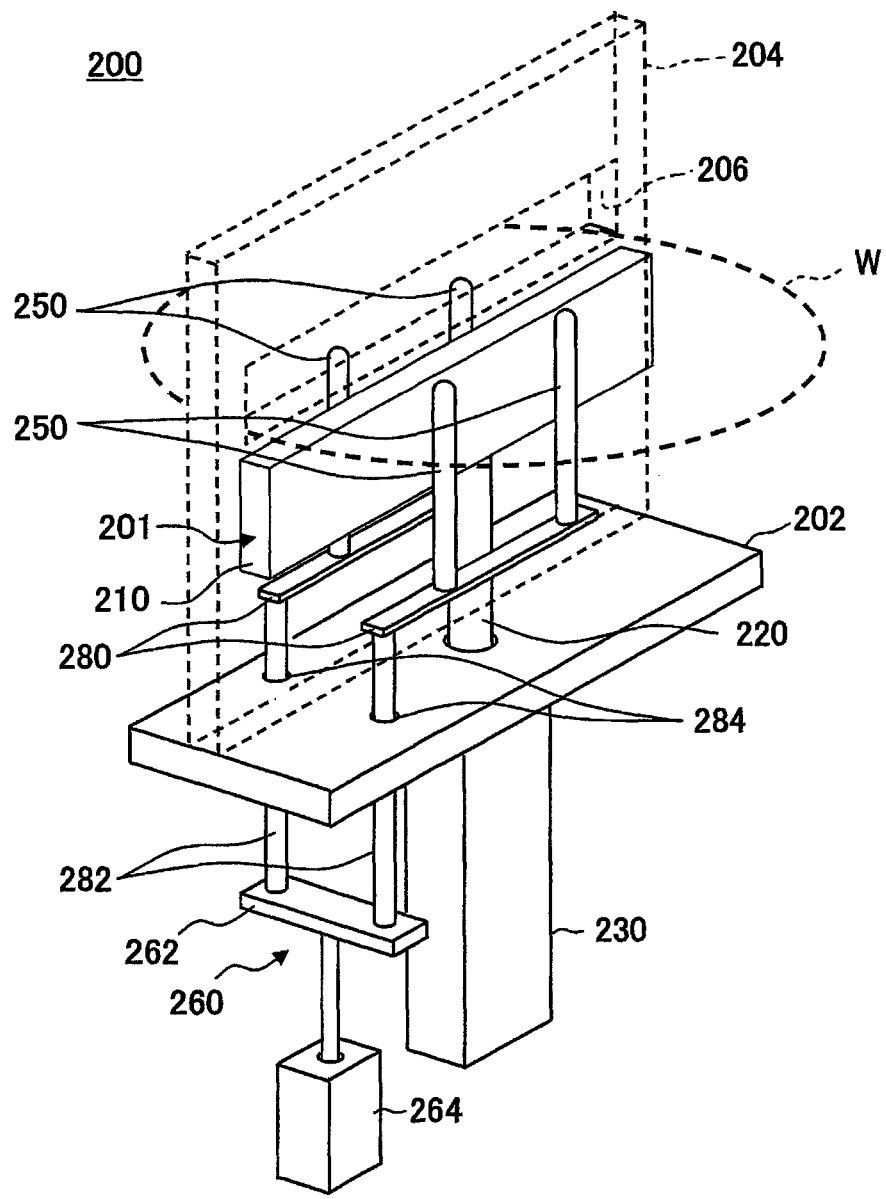
FIG. 10 is a perspective view illustrating a further exemplary modified configuration of the support pin elevating mechanism.

Further, in another alternative embodiment, as illustrated in FIG. 10, the substrate relay apparatus 200 may include plate members 280 that support the support pins 250 and are configured to be movable up and down. That is, elevating shafts 282 are arranged at the plate members 280, and the elevating shafts 282 are inserted into through holes 284 arranged at the bottom of the chassis 202. In this alternative embodiment, the base 262 that supports the elevating shafts 282 and the actuator 264 that drives the base 262 to move up and down are arranged below the chassis 202.

With such a configuration, by having the actuator 264 move the base 262 up and down, the plate member 280 may be moved up and down via the elevating shafts 282. In this way, the support pins 250 supported by the plate member 280 may be moved up and down altogether. Also, with this configuration, the support pins 250 do not have to be inserted through the bottom of the chassis 202. Thus, the number of through holes 284 for inserting the elevating shafts 282 through the bottom of the chassis 202 may be kept to a minimum rather than providing a number of through holes corresponding to the number of support pins 250 at the bottom of the chassis 202. That is, the number of through holes 284, which needs to be sealed, may be kept to a minimum regardless of the number of support pins 250.

In the substrate processing apparatus 100 according to an embodiment of the present invention, the substrate relay apparatus 200 has a gate valve arranged in its interior and support pins for supporting a wafer W arranged at both sides of the gate valve. With such a configuration, even when the substrate relay apparatus 200 is arranged between the transfer apparatuses 140A and 140B, the space between the transfer apparatuses 140A and 140B may be arranged to be relatively narrow so that space may be conserved and footprint requirements may be prevented from increasing as a result of arranging the substrate relay apparatus 200. In this way, footprint requirements of the substrate processing apparatus 100 may be reduced compared to conventional configurations.

Note that although the substrate relay apparatus 200 is arranged in the substrate processing apparatus 100 that has two vacuum processing units 110A and 110B connected in parallel to the loader chamber 130 in the above-described embodiments, the present invention is not limited to such embodiments. For example, the substrate relay apparatus 200 according to an embodiment of the present invention may be arranged in a substrate processing apparatus having three or more vacuum processing units connected in parallel to the loader chamber 130. In this case, the substrate relay apparatus 200 may be arranged between each set of adjacent transfer apparatuses of the vacuum processing units, or the substrate relay apparatus 200 may be arranged between at least one set of adjacent transfer apparatuses of the vacuum processing units.

(Alternative Substrate Processing Apparatus Configuration)

Figure 11:
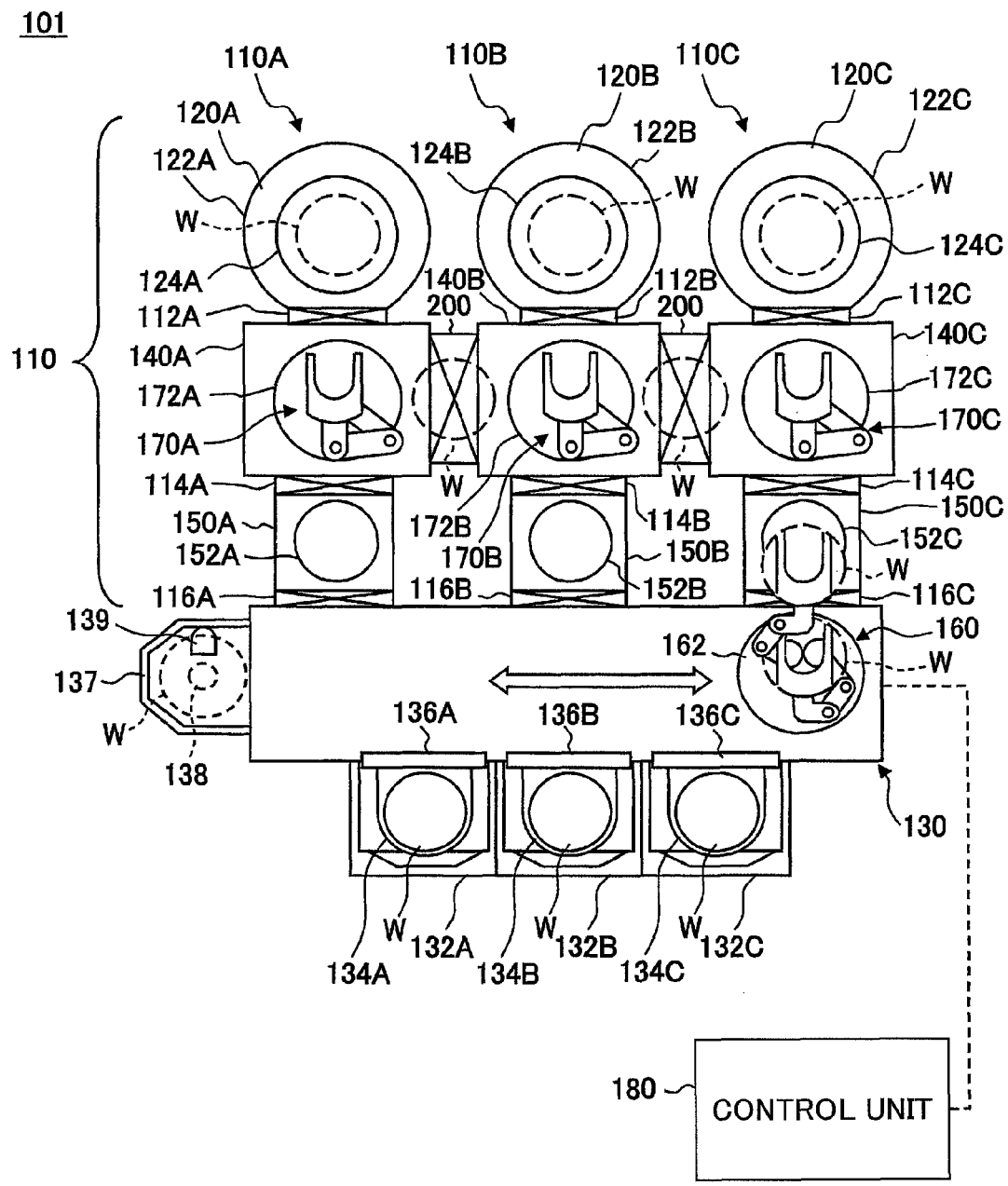
FIG. 11 is a horizontal cross-sectional view of another exemplary configuration of the substrate processing apparatus that may implement the substrate relay apparatus according to an embodiment of the present invention.

In the following, another exemplary configuration of a substrate processing apparatus that may implement the substrate relay apparatus 200 according to an embodiment of the present invention is described. FIG. 11 is a horizontal cross-sectional view of a substrate processing apparatus with an alternative configuration. FIG. 11 illustrates a case where the substrate relay apparatus 200 is implemented in a substrate processing apparatus 101 having three vacuum processing units 110A, 110B, and 110C that are connected in parallel to the loader chamber 130.

The configuration of the vacuum processing unit 110C may be identical to those of the vacuum processing units 110A and 110B. Accordingly, components of the vacuum processing unit 110C that have substantially the same functions as those of the vacuum processing units 110A and 110B are identified by the same reference numerals with the letter "C" added, and overlapping descriptions thereof are omitted.

The substrate processing apparatus 101 illustrated in FIG. 11 has the substrate relay apparatuses 200 arranged between transfer apparatuses 140A and 140B and between transfer apparatuses 140B and 140C.

In this configuration, by leaving the gate valves 201 of the substrate relay apparatuses 200 open during normal operation, for example, the processing apparatuses 120A and 120C may be configured to perform the same type of process (e.g., etching a target film using a resist film as a mask) on the wafer W while the processing apparatus 120B that is arranged in the middle may be configured to perform a post process to be performed after the processes performed by the processing apparatuses 120A and 120C (e.g., ashing the resist film).

In such a case, for example, the wafer W that is processed at the processing apparatus 120A is transferred from the processing apparatus 120A by the transfer arm mechanism 170A of the transfer apparatus 140A and is passed on to the transfer arm mechanism 170B of the transfer apparatus 140B via the substrate relay apparatus 200 that is arranged adjacent to the transfer apparatus 140A to be transferred to the processing apparatus 120B. In this way, the wafer W processed at the processing apparatus 120A may be successively processed at the processing apparatus 120B without being exposed to the atmosphere.

Similarly, the wafer W that is processed at the processing apparatus 120C is transferred from the processing apparatus 120C by the transfer atm mechanism 170C of the transfer apparatus 140C and is passed on to the transfer arm mechanism 170B of the transfer apparatus 140B via the substrate relay apparatus 200 that is arranged adjacent to the transfer apparatus 140C to be transferred to the processing apparatus 120B. In this way, the wafer W processed at the processing apparatus 120C may be successively processed at the processing apparatus 120B without being exposed to the atmosphere.

As the parallel wafer processing operations by the processing apparatus 120A or 120C and the processing apparatus 120B are successively performed, for example, a situation may arise where maintenance operations have to be performed on the transfer apparatus 140C. In such a case, the only the gate valve 201 of the substrate relay apparatus 200 adjacent to the transfer apparatus 140C is closed. In this way, even while maintenance operations are performed on the transfer apparatus 140C, the transfer apparatuses 140A and 140B may continue operating. Thus, even when maintenance operations are performed on the transfer apparatus 140C, processing of the wafers W using the processing apparatuses 120A and 120B may be continued so that a decrease in the throughput may be curbed, for example.

In the following, features and advantages of the above-described embodiments of the present invention are summarized.

According to one aspect of the present invention, a substrate processing apparatus is provided that includes a plurality of transfer apparatuses that are configured to transfer a substrate to/from a processing apparatus, which performs a predetermined process on the substrate; and a substrate relay apparatus that is arranged between at least two of the transfer apparatuses that are adjacent to each other, the substrate relay apparatus being configured to relay the substrate between the adjacent transfer apparatuses. The substrate relay apparatus 200 includes the chassis 202 that is arranged to surround openings formed at side walls of the transfer apparatuses, the chassis having a dimension in a width direction between the side walls of the transfer apparatuses that is smaller than a dimension of the substrate; the gate valve 201 that is arranged inside the chassis 202 between the side walls of the adjacent transfer apparatuses and is configured to open and close with respect to the openings; and at least three support pins 250 that are arranged at both sides of the gate valve 201 and are configured to support the substrate that straddles the gate valve 201.

With such a configuration, when exchanging a substrate between the transfer apparatuses via the substrate relay apparatus 200, by placing the substrate on the support pins 250 that are arranged at both sides of the gate valve 201, the substrate may be supported while straddling the gate valve 201. In this case, the substrate does not have to be accommodated within the chassis 202 so that the dimension of the chassis 202 in the width direction between the side walls of the transfer apparatuses may be arranged to be smaller than the substrate size. Accordingly, the space between the transfer apparatuses may be narrowed so that space may be conserved and an increase in footprint requirements as a result of arranging the substrate relay apparatus 200 may be curbed. In this way, footprint requirements may be significantly reduced compared to conventional configurations.

Also, the gate valve 201 includes a valve element 210 that is configured to be movable to open and close a substrate transfer port that is formed at a partition wall 204, which partitions an internal space of the chassis into a first space toward one of the adjacent transfer apparatuses and a second space toward the other one of the adjacent transfer apparatuses. The support pins 250 may be arranged at both sides of the partition wall 204, for example. In this way, the substrate may be placed on the support pins 250 while being inserted through the substrate transfer port.

Also, the support pins 250 may be arranged to be movable up and down, and a support pin elevating mechanism 260 that is configured to drive the support pins 250 to move up and down may be provided. The support pin elevating mechanism 260 may include a base 262 that supports the support pins 250 and an actuator 264 that drives the base 262 to move up and down. In this way, the height of the support pins 250 may be adjusted, and the support pins 250 may be moved up and down to receive the substrate from a transfer arm mechanism of one of the transfer apparatuses, for example.

Also, the transfer apparatuses may each include transfer arm mechanisms, and when exchanging the substrate between the transfer arm mechanisms while the gate valve 201 is open, a first transfer arm mechanism of the transfer arm mechanisms may arrange the support pins 250 to support the substrate that straddles the gate valve 201, and a second transfer arm mechanism of the transfer arm mechanisms may receive the substrate from the support pins 250. In this way, the substrate may be exchanged through cooperation of the transfer arm mechanisms.

Also, the gate valve may be opened when both of the adjacent transfer apparatuses are operating normally, and the gate valve may be closed when maintenance operations are performed on one of the adjacent transfer apparatuses. In this way, even when maintenance operations are performed on one of the transfer apparatus, the other transfer apparatus may be used to continue substrate processing operations so that a decrease in throughput may be curbed.

Also, the substrate processing apparatus according to an embodiment of the present invention may include a plurality of load-lock chambers that are connected to the transfer apparatuses via gate valves and are configured to transfer the substrate to/from the transfer apparatuses; and a loader chamber 130 that is connected to the load-lock chambers via gate valves and is configured to transfer the substrate to/from the load-lock chambers. When maintenance operations are performed on a given load-lock chamber of the load-lock chambers, the gate valve that is arranged between the given load-lock chamber and the transfer apparatus that is connected to the given load-lock chamber may be closed; and the substrate that should normally be transferred from the given load-lock chamber may be transferred from another load-lock chamber of the load-lock chambers and exchanged between the transfer apparatuses via the substrate relay apparatus 200 to be transferred to the processing apparatus so that processing of the substrate may be continued. In this way, even when maintenance operations are performed on a given load-lock chamber, the substrate relay apparatus 200 that is arranged between the transfer apparatuses may be used to transfer the substrate via another load-lock chamber so that the substrate may be transferred to the corresponding processing apparatus at which the substrate apparatus is to be processed. In this way, even when maintenance operations are performed on a load-lock chamber, a decrease in the throughput may be curbed.

Further, the substrate processing apparatus according to an embodiment of the present invention may include a plate member that is connected to the top ends or bottom ends of the support pins 250.

According to another aspect of the present invention, a substrate relay apparatus is provided that is arranged between at least two adjacent transfer apparatuses of a plurality of transfer apparatuses that are configured to transfer a substrate to/from a processing apparatus, which performs a predetermined process on the substrate. The substrate relay apparatus 200 includes a chassis 202 that is arranged to surround openings formed on side walls of the adjacent transfer apparatuses and has a dimension in a width direction between the side walls of the adjacent transfer apparatuses that is smaller than a dimension of the substrate; a gate valve 201 that is arranged inside the chassis 202 between the side walls of the adjacent transfer apparatuses and is configured to open and close with respect to the openings; and at least three support pins 250 that are arranged at both sides of the gate valve 201 and are configured to support the substrate that straddles the gate valve 201.

According to another aspect of the present invention, a substrate relay method is provided for relaying a substrate using a substrate relay apparatus that is arranged between at least two adjacent transfer apparatuses of a plurality of transfer apparatuses that are configured to transfer a substrate to/from a processing unit, which performs a predetermined process on the substrate. The substrate relay apparatus 200 includes a chassis 202 that is arranged to surround openings formed on side walls of the adjacent transfer apparatuses and has a dimension in a width direction between the side walls of the adjacent transfer apparatuses that is smaller than a dimension of the substrate, a gate valve 201 that is arranged inside the chassis 202 between the side walls of the adjacent transfer apparatuses and is configured to open and close with respect to the openings, and at least three support pins 250 that are arranged at both sides of the gate valve 201. The substrate relay method includes exchanging the substrate between transfer arm mechanisms that are arranged at the transfer apparatuses, such exchange involving the support pins 250 supporting the substrate that is transferred by a first transfer arm mechanism of the transfer arm mechanisms and is arranged to straddle the gate valve 201 that is open, and a second transfer arm mechanism of the transfer arm mechanisms receiving the substrate from the support pins 250.

Although certain preferred embodiments of the present invention have been described above with reference to the accompanying drawings, the present invention is not limited to these embodiments described above, and numerous variations and modifications may be made without departing from the scope of the present invention.

For example, the substrate processing apparatus that may implement the substrate relay apparatus of the present invention is not limited to the substrate processing apparatus described above. That is, the substrate relay apparatus of the present invention may be implemented in any type of substrate processing apparatus having adjacent transfer apparatuses.

INDUSTRIAL APPLICABILITY

The present invention may be applicable to a substrate relay apparatus that is arranged between a plurality of transfer apparatuses that are configured to transfer a substrate to be processed such as a semiconductor wafer, a substrate relay method, and a substrate processing apparatus.

The present application is based on and claims the benefit of priority of Japanese Patent Application No. 2011-025389 filed on Feb. 8, 2011, the entire contents of which are herein incorporated by reference.

DESCRIPTION OF THE REFERENCE NUMERALS

100, 101 substrate processing apparatus
110A, 110B, 110C vacuum processing unit
112A, 112B, 112C gate valve
114A, 114B, 114C gate valve
116A, 116B, 116C gate valve
120A, 120B, 120C processing apparatus
122A, 122B, 122C processing container
124A, 124B, 124C stage
130 loader chamber
132A, 132B, 132C cassette stage
134A, 134B, 134C cassette container
136A, 136B, 136C load port
137 orienter
138 rotary stage
139 optical sensor
140A, 140B, 140C transfer apparatus
144 opening
150A, 150B load-lock chamber
152A, 152B stage
160, 170A, 170B, 170C transfer arm mechanism
162, 172A, 172B, 172C base
180 control unit
200 substrate relay apparatus
201 gate valve
202 chassis
204 partition wall
206 substrate transfer port
210 valve element
220 elevating shaft
230 elevation guide frame
232 valve element drive unit
240 belows
250 support pin
260 support pin elevating mechanism
262 base
264 actuator
266 through hole
268 seal member
270 plate member
280 plate member
282 elevating shaft
284 through hole
W wafer

The invention claimed is:

1. A substrate processing apparatus comprising:
a plurality of transfer apparatuses that are configured to transfer a substrate having a circular shape to/from a processing apparatus, which performs a predetermined process on the substrate; and
a substrate relay apparatus that is arranged between at least two of the transfer apparatuses that are adjacent to each other, the substrate relay apparatus being configured to relay the substrate between the adjacent transfer apparatuses;
wherein the substrate relay apparatus includes
a chassis that is arranged to surround openings formed at side walls of the transfer apparatuses, the chassis having a partition wall with a substrate transfer port that is arranged so as to divide an internal space within the chassis between the transfer apparatuses, the chassis having a dimension in a width direction between the side walls of the transfer apparatuses that is smaller than a diameter of the substrate;
a gate valve that is arranged inside the chassis between the side walls of the adjacent transfer apparatuses and is configured to open and close the substrate transfer port; and
at least three support pins that are arranged so that at least one of the support pins is arranged on one side of the gate valve and the other support pins are arranged on other side of the gate valve to support the substrate that straddles the gate valve.

2. The substrate processing apparatus as claimed in claim 1, wherein
the gate valve includes a valve element that is configured to be movable to open and close a substrate transfer port that is formed at a partition wall, which partitions an internal space of the chassis into a first space toward one of the adjacent transfer apparatuses and a second space toward the other one of the adjacent transfer apparatuses; and
the support pins are arranged at both sides of the partition wall.

3. The substrate processing apparatus as claimed in claim 2, further comprising:
a support pin elevating mechanism that is configured to drive the support pins to move up and down;
wherein the support pin elevating mechanism includes a base that supports the support pins and an actuator that drives the base to move up and down.

4. The substrate processing apparatus as claimed in claim 1, wherein
the transfer apparatuses each include transfer arm mechanisms; and
when exchanging the substrate between the transfer arm mechanisms while the gate valve is open, a first transfer arm mechanism of the transfer arm mechanisms arranges the substrate on the support pins to support the substrate that straddles the gate valve, and a second transfer arm mechanism of the transfer arm mechanisms receives the substrate from the support pins.

5. The substrate processing apparatus as claimed in claim 1, wherein
the gate valve is opened when both of the adjacent transfer apparatuses are in an operating state, and the gate valve is closed when maintenance operations are performed on one of the adjacent transfer apparatuses.

6. The substrate processing apparatus as claimed in claim 1, further comprising:
a plurality of load-lock chambers that are connected to the transfer apparatuses via load-lock gate valves and are configured to transfer the substrate to/from the transfer apparatuses; and
a loader chamber that is connected to the load-lock chambers via loader gate valves and is configured to transfer the substrate to/from the load-lock chambers;
wherein when maintenance operations are performed on one load-lock chamber of the load-lock chambers, the gate valve that is arranged between the one load-lock chamber and the transfer apparatus that is connected to the one load-lock chamber is closed; and
the substrate that is to be transferred from the one load-lock chamber is transferred from another load-lock chamber of the load-lock chambers and is exchanged between the transfer apparatuses via the substrate relay apparatus to be transferred to the processing apparatus so that processing of the substrate may be continued.

7. The substrate processing apparatus as claimed in claim 1, further comprising:
a plate member that is connected to top ends or bottom ends of the support pins.

8. A substrate relay apparatus that is arranged between at least two adjacent transfer apparatuses of a plurality of transfer apparatuses that are configured to transfer a substrate having a circular shape to/from a processing apparatus, which performs a predetermined process on the substrate, the substrate relay apparatus comprising:
a chassis that is arranged to surround openings formed on side walls of the adjacent transfer apparatuses, the chassis having a partition wall with a substrate transfer port that is arranged so as to divide an internal space within the chassis between the transfer apparatuses, the chassis having a dimension in a width direction between the side walls of the adjacent transfer apparatuses that is smaller than a diameter of the substrate;
a gate valve that is arranged inside the chassis between the side walls of the adjacent transfer apparatuses and is configured to open and close the substrate transfer port; and
at least three support pins that are arranged so that at least one of the support pins is arranged on one side of the gate valve and the other support pins are arranged on other side the gate valve to support the substrate that straddles the gate valve.

9. A method of relaying a substrate using a substrate relay apparatus that is arranged between at least two adjacent transfer apparatuses of a plurality of transfer apparatuses that are configured to transfer a substrate having a circular shape to/from a processing unit, which performs a predetermined process on the substrate,
wherein the substrate relay apparatus includes a chassis that is arranged to surround openings formed on side walls of the adjacent transfer apparatuses and has a partition wall with a substrate transfer port that is arranged so as to divide an internal space within the chassis between the transfer apparatuses, the chassis having a dimension in a width direction between the side walls of the adjacent transfer apparatuses that is smaller than a diameter of the substrate, a gate valve that is arranged inside the chassis between the side walls of the adjacent transfer apparatuses and is configured to open and close the substrate transfer port, and at least three support pins that are arranged so that at least one of the support pins is arranged on one side of the gate valve and the other support pins are arranged on other side of the gate valve to support the substrate that straddles the gate valve, the method comprising:
when exchanging the substrate between transfer arm mechanisms that are arranged at the transfer apparatuses, having the support pins support the substrate that is transferred by a first transfer arm mechanism of the transfer arm mechanisms and is arranged to straddle the gate valve that is open, and having a second transfer arm mechanism of the transfer arm mechanisms receive the substrate from the support pins.

* * * * *